United States Patent [19]

Golovanivsky et al.

[11] Patent Number: 5,352,899
[45] Date of Patent: Oct. 4, 1994

[54] METHOD AND APPARATUS FOR FABRICATING A DEVICE/CIRCUIT PATTERN BY A CONVERGING ATOMIC BEAM

[75] Inventors: Konstantin S. Golovanivsky, Grenoble, France; Erazm M. Omeljanovsky, New York, N.Y.

[73] Assignee: Ruxam, Inc., New York, N.Y.

[21] Appl. No.: 931,697

[22] Filed: Aug. 18, 1992

[51] Int. Cl.$^5$ .............................................. H01J 37/30
[52] U.S. Cl. ........................... 250/492.21; 250/423 R
[58] Field of Search ............ 250/251, 492.21, 423 R; 315/111.81

[56] References Cited

U.S. PATENT DOCUMENTS

| | | | |
|---|---|---|---|
| 4,113,514 | 7/1978 | Pankove et al. | 148/1.5 |
| 4,127,442 | 11/1978 | Logan | 176/3 |
| 4,224,084 | 9/1980 | Pankove | 148/1.5 |
| 4,361,761 | 11/1982 | Treglio | 250/251 |
| 4,559,096 | 12/1985 | Friedman et al. | 156/272.2 |
| 4,940,893 | 7/1990 | Lo | 250/424 |
| 4,952,273 | 8/1990 | Popov | 156/643 |
| 5,059,866 | 10/1991 | Lo | 315/111.21 |
| 5,111,042 | 5/1992 | Sullivan et al. | 250/251 |

OTHER PUBLICATIONS

Garner et al. "An Inexpensive X-ray Source Based On An Electron Cyclotron" Rev. Sci Instrum. 61(2), Feb. 1990, pp. 724–727.

Brynjolfsson "Factors Influencing Economic Evaluation Of Irradiation Processing" Factors Influencing The Economical Application Of Food Irradiation Symposium Proceeding, Jun. 14–18, 1971, 1973, pp. 13–35.

Popov, "An Electron Cyclotron Plasma Stream Source For Low Pressure Thin Film Production" Surface and Coatings Technology, 36 (1988) pp. 917–925.

Product Literature for ECR System 9200, Plasma Stream Sources Models 904, 904GR, 906, 906GR, 908. ECR Ion Miller Model 1M601, ECRJr. Research System, Micromagnitrons, Micro 1000 Heater, Researcher 101, ECR Retrofit by Microscience, nine single pages and one tri-fold document.

Shapoval et al., "Cubic Boron Nitride Films Deposited by Electron Cyclotron Resonance Plasma" Appl. Phys. Lett. 57(18), Oct. 29, 1990, pp. 1885–1886.

Popov "Electron Cyclotron Resonance Plasmas Excited By Rectangular and Circular Microwave Modes" J.V. Sci. Technical A 8(3)May/Jun. 1990.

Popov et al., "Microwave Plasma Source For Remote Low Energy Ion Stream" Rev. Sci. Instrum. 61 (1), Jan. 1990 pp. 300–302.

Popov et al., "Electron Cyclotron Resonance Sources For Wide and Narrow Plasma Streams", Rev. Sci. Instrum., 61(1), Jan. 1990 pp. 303–305.

Popov et al., "Electron Cyclotron Resonance Plasma Stream Source For Plasma Enhanced Chemical Vapor Deposition" J. Vac. Technol. A7(3) May/Jun. 1989 pp. 914–917.

Balmashnov et al., "Passivation of GaAs by Atomic Hydrogen Flow Produced by the Crossed Beams Method" Semicond. Sci. Technol, 5 (1990) pp. 242–245.

Omeljanovsky et al. "Hydrogen Passivation of Defects and Impurities GaAs and InP" J. Electronic Materials, vol. 18, No. 6, 1989 pp. 659–670.

(List continued on next page.)

*Primary Examiner*—Bruce C. Anderson
*Attorney, Agent, or Firm*—Davis Hoxie Faithfull & Hapgood

[57] ABSTRACT

Methods and apparatus for etching ultra fine lines of impurities on semiconductors and other materials. A cold diverging ion beam is generated, made to converge, encoded using a mask to correspond to an image, and then used to etch impurities on the substrate. An ECR plasma source is used to generate a warm plasma. A cooled neutral target gas is penetrated by the warm plasma ions so that the plasma ion charge is transferred to the cool target gas to provide cool ions, which are then extracted to provide a cryogenic ion beam. The ion beam is made converging and then encoded by the mask. The ion beam also may be transformed into an atom beam in a charge exchange cell.

52 Claims, 2 Drawing Sheets

OTHER PUBLICATIONS

Balmashnov et al. "CERA-C: The System For Hydorgenation of Semiconductors by the method of Crossed Beams":, Contributed Papers of XX International Conference on phenomena in ionized Gases, Pisa, Italy, Jul. 1991.

Polyakov, et al. "The Effect of Hydrogen On Bulk And Surface Traps In Indium Antimonide", Solid State Communications, vol 74, No. 8, pp. 711-715 (1990).

Polyakov et al. "Atomic Hydrogen Passivation of Deep Levels Activity In $Al_xGa_{1-x}A_s$ Multiquantum Well Structures", Solid State Communication vol. 76, No. 6, pp. 761-763 (1990).

Pakhomov et al., "Atomic Hydrogen Modification of Polycrystalline Silicon Solor Cells Characteristics", Solid State Communications, vol. 76, No. 7, pp. 887-890 (1990).

Barbour et al. "Solicon Nitride Formation from a Silane-Nitrogen Electron Cyclotron Resonance Plasma", J. Vac. Sci. Technol-A, vol. 9, No. 3, May/Jun. 1991, pp. 480-484.

Knox et al. "Characterization of Electronic and Optical Properties of Device Quality a-Si:H and a-(Si,Ge): H grown by remote plasma electron cyclotron Resonance deposition", J. Vac. Sci Technol A, vol. 9, No. 3, May/Jun. 1991 pp. 474-479.

Popov, "Effects of Magnetic Field and Microwave Power on Electron Cyclotron Resonance Type plasma characteristics" J. Vac. Sci. Technol A, vol. 9, No. 3, May/Jun. 1991 pp. 711-716.

Conrad et al., "Plasma source ion-implantation technique for Surface Modification of Materials", J. Appl. Phy., vol. 62, No. 11, Dec. 1987, pp. 4591-4596.

Hirano et al. "Extension of Bearing Endurance Life By Ion Implantation" Appl. Phys. Lett., vol. 49, No. 13, 29 Sep. 1986, pp. 779-781.

METHOD AND APPARATUS FOR FABRICATING A DEVICE/CIRCUIT PATTERN BY A CONVERGING ATOMIC BEAM

FIELD OF THE INVENTION

The present invention relates to the field of lithography, and more particularly to lithographic machines and techniques involving ion and atom beams for semiconductor and other materials.

BACKGROUND OF THE INVENTION

The desire for semiconductor chips with memory structures denser than 256 megabytes has created the demand for machines and techniques which allow the etching of ultrafine lines of impurities in semiconductors. Some of the techniques currently used to etch such ultrafine lines are X-ray, electron beam, and ion beam lithography.

Of the aforementioned techniques, the X-ray method is believed to be the most advanced. Compact synchrotrons are being tested and improved as X-ray beam sources for use in chip making. However, X-ray lithography only has a feasible resolution of about 0.2 microns.

In order to overcome this resolution barrier, an approach using particles, such as atoms, electrons, or ions, is preferred to an approach using X-rays for several reasons. First, particles do not penetrate as far below a semiconductor substrate surface as X-ray photons. This results in the ability to etch relatively finer lines on a target. Second, shorter wavelengths, which also enable the etching of finer lines, can be more easily provided for particles than for X-ray photons. In this regard, the energy required to produce a particle beam of a given wavelength is far less than that required to produce an X-ray photon beam of the same wavelength and intensity.

The ion beam lithographic method is preferable over both the X-ray and the electron beam method because the relatively heavier ion particles couple well with various resist materials, do not damage an underlying circuit layer, scatter weakly, and allow for image demagnification.

However, there are at least two significant problems with the ion beam approach. One problem is that, in order to treat solid state surfaces at a high rate, an ion beam of high enough current density must be used. At high current densities, electrostatic repulsion of ions strongly distorts the image or the pattern etched. A second problem is that existing ion sources cause high ion temperatures which can result in the thermal distortion of the etched image. Therefore, in order to produce a heavy particle beam approach to lithography which is to be competitive or better than current X-ray approaches, one has to first overcome the problems of electrostatic and thermal distortion of the etched image while producing a sufficiently intense particle beam.

OBJECTS AND SUMMARY OF THE INVENTION

It is an object of the present invention to provide a method and apparatus for particle beam lithography that does not thermally and electrostatically distort the etched image.

It is another object of the present invention to provide a particle beam that is very cold ($T_1 < 0.1$ eV, where $T_1$ = kinetic temperature of ions) and sufficiently intense (on the order of 10 μA) for use in lithography.

It is another object of the present invention to provide for ultrafine etching of semiconductor chips, with such etching attaining a resolution of less than 0.2 microns.

It is another object of the present invention to provide for an ion and atom beam lithographic method and apparatus wherein a cryogenic ion source is used to minimize thermal distortion of an etched image.

It is another object of the present invention to provide for an ion and atom beam lithographic method and apparatus wherein an ion beam is transformed into an atom beam in order to minimize electrostatic distortion of an etched image.

In accordance with a first aspect of the invention, an ion source is provided in which a warm Helium plasma is created, the warm Helium ions of this plasma are extracted and made to collide with and transfer their positive charges to cold Helium gas atoms in a cryogenic charge exchange chamber. Preferably, parasitic warm Helium ions are removed from the cold ionic beam emerging from the cryogenic charge exchange chamber by use of an ion energy monochromator.

In accordance with a second aspect of the invention a charge exchange cell is further provided which converts a Helium ion beam into Helium atom beam.

Advantageously, the present invention produces a high quality converging ion beam with extremely low ion temperature to minimize thermal distortion of an etched image or pattern. Furthermore, the cryogenic ion beam produced in accordance with the present invention may be further transformed, by an ion-atom charge exchange cell, into a converging atomic beam, thereby to minimize distortion of an etched pattern due to electrostatic repulsion of ions. Either the ion or the atom beam may be used to etch an image or other pattern in semiconductor materials, structures and devices. The present invention is thus designed to retain all the advantages of ion beam lithography while avoiding its deficiencies.

BRIEF DESCRIPTION OF THE DRAWINGS

These and other objects, aspects, and embodiments of the present invention will be described with reference to the following drawing figures, of which.

DETAILED DESCRIPTION OF THE INVENTION

Figure 1:
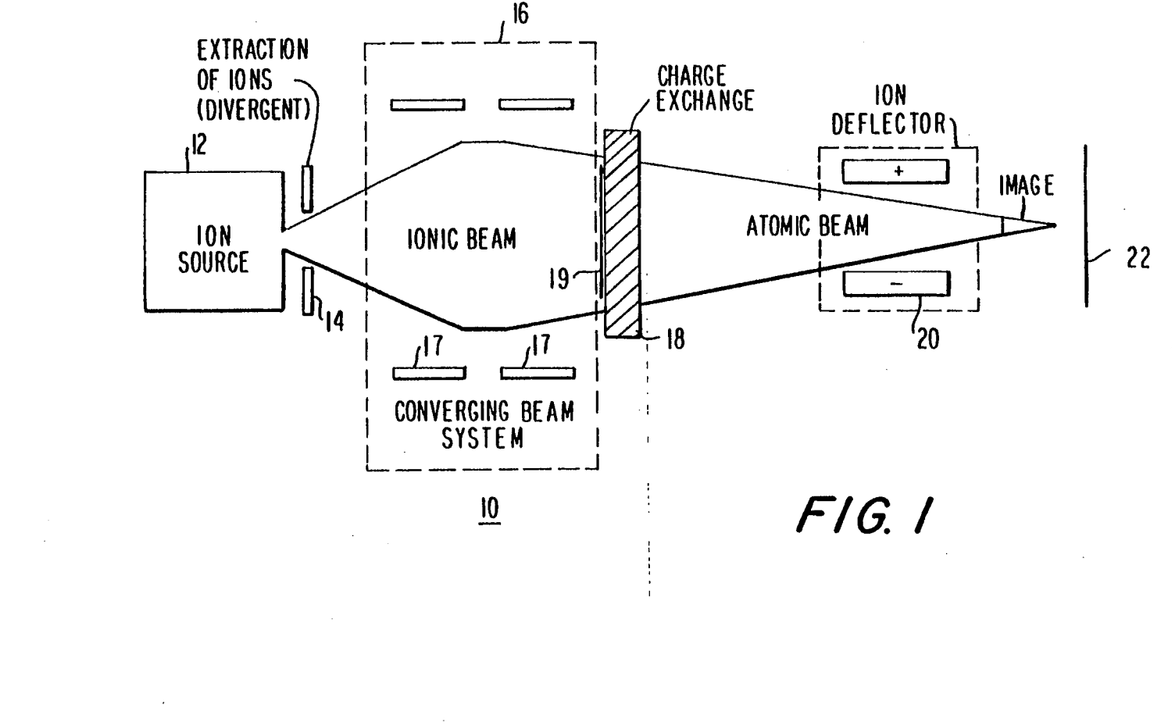
FIG. 1 illustrates a block diagram of a converging atomic beam lithography device in accordance with the present invention.

An overall block diagram of an ion-atom etching apparatus 10 and method in accordance with the present invention is shown in FIG. 1. The ion-atom etching apparatus 10 includes a cryogenic ion source 12, a converging beam system 16, an ion-atom charge exchange cell 18, and an ion deflector 20.

The cryogenic ion source 12 produces an ion beam through an opening 14, which may be an extraction orifice presenting a selected extraction potential, and is typically divergent. The divergent ion beam passes into converging beam system 16, which causes the beam to converge. System 16 may include one or more cylindrical electrostatic or magnetic devices 17 (two are shown)

having the appropriate potential or field strength to cause the desired convergence. The convergent ion beam passes through a mask 19, which encodes the beam with the image or pattern to be etched.

The encoded beam then may be passed into ion-atom charge exchange cell 18 to convert most of the ions into neutral atoms. This produces a convergent beam of mostly neutral atoms exiting the charge exchange cell 18. The remaining ions may be removed by ion deflector 20. The image or pattern is then etched by the atoms upon a suitable target 22, e.g., a semiconductor 22.

Figure 2:
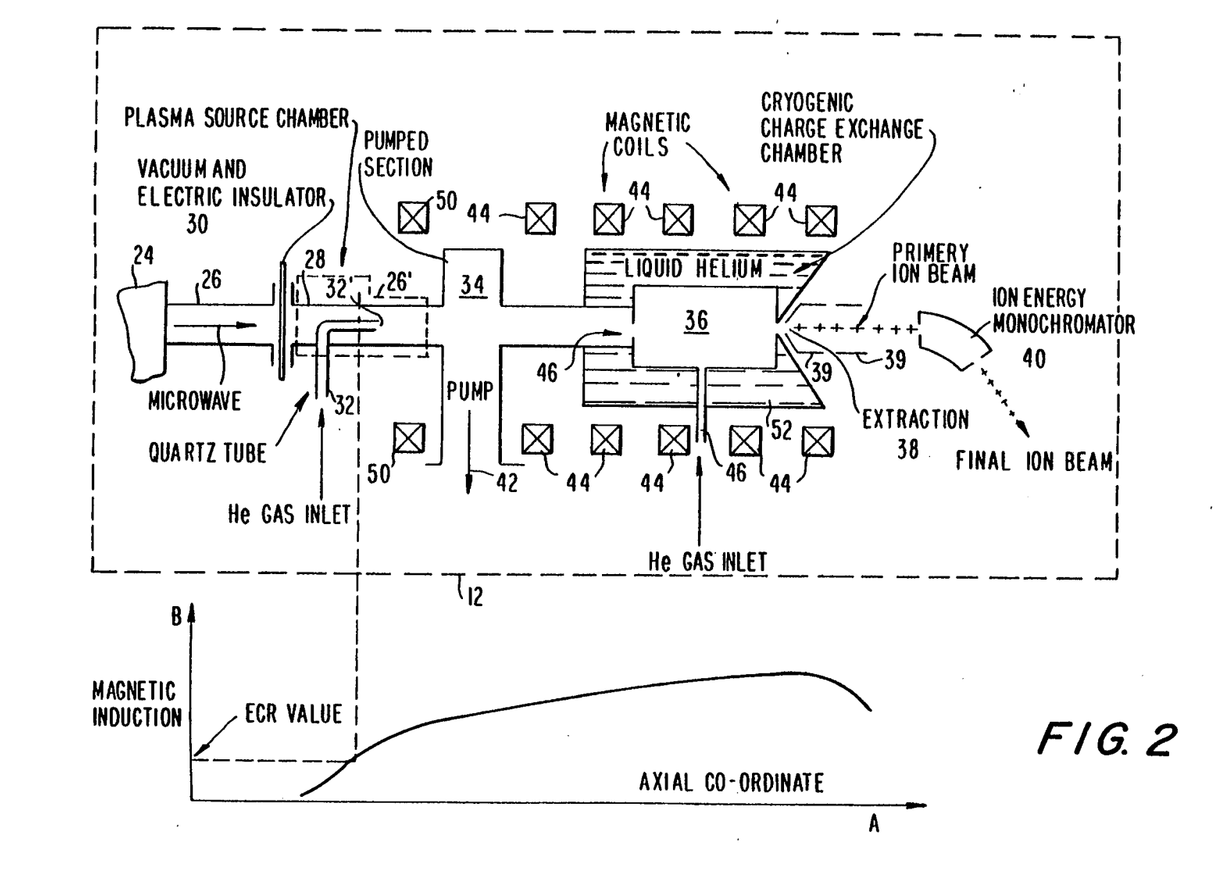
FIG. 2 illustrates a block diagram of the ion source of FIG. 1, with reference to the magnetic field B profile along the axis A of the source.

FIG. 2 illustrates a detailed diagram of cryogenic ion source 12 in accordance with an embodiment of the present invention. Source 12 includes a UHF energy source 24, a plasma source chamber 28, a pumping section 34, a cryogenic charge exchange chamber 36, and an ion energy monochromator 40.

Source 24 injects UHF energy into the ion source 12 through a waveguide 26. The waveguide 26 is connected to a plasma source chamber 28 through a vacuum and electric insulator 30. Insulator 30 is preferably a dielectric material such as, for example, nylon or teflon, which is transparent to microwaves, electrically insulates chamber 28 from waveguide 26, and preserves a vacuum inside plasma discharge chamber 28.

Plasma discharge chamber 28 is used for igniting and maintaining a plasma discharge under Electron Cyclotron Resonance (ECR) conditions. The chamber 28 is made of a length of standard vacuumated waveguide 26, illustrated in FIG. 2 as 26', and a dielectric tube 32 which passes through the wall of chamber 28 and opens inside chamber 28. A plasma support gas (or working gas) is passed through tube 32 and a plasma is ignited inside tube 32 under conditions of Electron Cyclotron Resonance. Preferably, the working gas pressure inside tube 32 is on the order of $10^{-4}$ Torr while the residual pressure is on the order of $10^{-6}$ Torr. Chamber 28 (ECR plasma source) has an open end, opposite insulator 30, for outputting a plasma flow. Any other type of plasma source may be used instead of the ECR plasma source 28 described.

In the embodiment shown, each of source 24, waveguide 26, and plasma discharge chamber 28 are axially aligned along and about the first axis. Non symmetrical and non axially aligned structures also may be used, provided that adjustments are made in the magnetic fields as described below so that the desired dense plasma is provided in a stable manner for the purposes described herein.

The plasma source chamber 28 is essentially disposed within a magnetic field that maintains the plasma discharge in tube 32 at a suitable density. The net magnetic field |B| along the first axis A is illustrated in FIG. 2. It is preferably comprised of a magnetic mirror having an axisymmetric magnetic profile. The field profile is initially established to facilitate creation of the plasma at the start of operation, and to form converging magnetic field lines so that the cold ECR plasma diffuses along the field lines on the first axis.

The net magnetic field profile may be adjusted during operation for optimal operation. More specifically, the magnetic field profile is adjusted so that the value of the magnetic field strength inside chamber 28 during the start-up of operation can be varied around the ECR value for the UHF-microwave frequency used. As illustrated in FIG. 2, the magnetic field is at about the ECR value near the open end 32 of the dielectric tube 32.

Referring to FIG. 2, in a preferred embodiment the axisymmetric magnetic field is generated by a magnetic device 50 and a series of magnetic devices 44, each of which may be an electromagnet, a permanent magnet or a solenoid, in any combination. Preferably, each magnetic device 50 and 44 is a solenoid, and is hereafter referred to as a solenoid.

Solenoid 50 provides the axially symmetric magnetic mirror in discharge chamber 28. The mirror ratio is preferably in the range of 1.2 to 5.0, more preferably between 2 and 4. Solenoid 50 is positioned in axial alignment with the first axis A. It is spaced with its midplane a distance from the end of dielectric tube 32 to provide a magnetic field strength in tube 32 that would be equal during the start-up to the ECR value for the selected microwave frequency. For example, for a frequency of 2.45 GHz, the magnetic field strength for the ECR value is 875 gauss, while for the frequency 10 GHz it is 3.6 kilogauss.

The initial magnetic profile is provided with a field strength in tube 32, on the side oriented toward source 24, that is lower than the ECR value, and a field strength on the other side higher than the ECR value. During operation, solenoid 50 may be mechanically and/or electrically adjusted to adjust the magnetic field |B| profile in chamber 28 to obtain the best condition of continued operation, namely, the creation and the contained maintenance of a stable plasma.

As an example of one embodiment, if the microwave frequency of 2.45 GHz is used, the solenoid 50 is made of water cooled copper wire and produces a field strength of the order of from 0 to 0.3 Tesla, preferably 0.2 Tesla in its central plane. It may be made of an 8×8 mm copper conductor having a 4 mm inner diameter for cooling water. Solenoid 50 has 44 turns having an inner diameter of 250 mm, an outer diameter of 360 mm and a length of 80 mm. Solenoid 50 at start-up requires 8.9 volts and 600 amps.

Chamber 28 is evacuated to a pressure on the order of $10^{-5}$ to $10^{-6}$ Torrs to provide for plasma ignition under ECR conditions inside tube 32. A conventional pump (not shown), such as turbomolecular pump having a pumping capacity of 1,000 L/min, may be used to create the reduced pressure. It should be understood that the plasma also could be created in other ways, by other plasma sources, and that gases other than helium can be used as the support material for the plasma and for the ion and atom beam formed therefrom.

Solenoids 44 are located downstream of the pumping section 34 and are spaced along the cryogenic charge exchange chamber 36. The net magnetic mirror profile provides two advantages. First, it causes perpendicularly energetic electrons to be reflected, so that they are not likely to pass into charge exchange chamber 36. As a result, less thermal energy is brought to chamber 36. In addition, the increasing magnetic field stabilizes the plasma against magnetohydrodynamic (MHD) turbulence, which can cause the plasma to move in an unstable manner.

After being generated in tube 32, the plasma passes through pumping section 34. Pumping section 34 is designed to pump out, through outlet 42, any warm neutral atoms of Helium remaining in the flow. The charged matter is restrained from flowing out outlet 42 by the net magnetic field and thus passes through pumping section 34.

The plasma next diffuses through a first inlet 46 into the cryogenic charge exchange chamber 36. The cryogenic charge exchange chamber 36 is cooled by liquid Helium, illustrated in FIG. 2 as horizontal dashes in area 52, which is located outside of and in contact with the walls bounding the inside of chamber 36. The Helium can be kept at liquid temperature by any of a number of conventional processes.

A second inlet 46 allows Helium gas to enter the chamber 36. This Helium gas is injected to maintain in equilibrium the helium atom concentration sufficient to provide a charge exchange target, as discussed below, and is cooled by the chamber 36. More particularly, it is cooled by passing through a tube bathed in the liquid helium and by the walls of chamber 36. The cooled helium gas is a target gas as follows. The warm Helium plasma from the pumping section 34 passes into chamber 36 and the warm Helium plasma ions collide with the cooled neutral Helium target gas molecules and atoms. The collisions result in a transfer of charge to the cooled Helium gas particles. After the warm Helium plasma ions have lost their charge, they become neutral particles. The neutral particles then fall, contact the cooled walls of chamber 36, and lose their thermal energy.

The cooled Helium gas atoms thus become ions at liquid Helium temperature. The cooled Helium ions diffuse to the extraction orifice 38 with the same velocity as the plasma flow rate during entry into the cryogenic chamber 36. This is because the electron kinetic temperature does not change significantly between these stages, and the diffusion of ions in a plasma is largely dependent on the electron kinetic temperature rather than on the ion kinetic temperature. The electron kinetic temperature does not vary significantly because collisions between electrons and cold Helium ions are not likely. Thus, the cooled helium target gas ions provide a cryogenic ion flow.

The interrelationship between ion diffusion rate and electron kinetic temperature will now be explained. Plasma sets up a sheathlike electrical potential at a boundary which forces the loss rate of electrons and ions to be the same. This potential is known in the art as the "ambipolar potential" and exists because electrons have much greater mobility than ions, and will thus attempt to diffuse more quickly. Electrons with higher kinetic temperatures attempt to diffuse more rapidly than those with lower kinetic temperatures causing greater ambipolar potentials, which inevitably cause greater ion diffusion rates. The diffusion of electrons and ions in this situation is known in the art as ambipolar diffusion. Ion diffusion is based largely on the magnitude of the ambipolar potential which is based upon the electron kinetic temperature, rather than on the ion kinetic temperature.

It is undesirable that the ambipolar electrical potential affect the perpendicular energy of the ion beam which emerges from the extraction orifice 38, e.g., the small end of a conventional conical electrode. Therefore, the extraction orifice 38 is made much smaller than the plasma diameter, i.e., the dimensions over which the radial ambipolar electrical potential acts. Thus, the radial ambipolar potential seen at the extraction orifice 38 will be a small fraction of the entire radial ambipolar potential. The significance of this is discussed below.

The ion beam which comes out of the extraction orifice 38 passes through cylindrical electrodes 39 for profiling the beam. It may contain some parasitic warm ions in addition to the desired cryogenic ions. Accordingly, one aspect of this embodiment of the present invention also provides for passing the ion beam through an energy monochromator 40 which selectively passes the cryogenic component of the ion beam, but not the thermal component of the ion beam. Monochromator 40 may be any conventional magnetic, electrostatic or electromagnetic type device.

The following are examples of parameters for an ion source such as the one previously described. The microwave power source 24 may have a frequency of 2.45 GHz. At this frequency a warm Helium ECR plasma ($T_e = 10$ eV, $T_1 = 1$ eV, $n = 1*10^{10}$ ions/cm$^3$, where $T_e$ is the kinetic temperature of electrons and $T_1$ is the kinetic temperature of ions) is usually produced at a Helium gas pressure of about $5*10^{-4}$ Torr without difficulty. At this pressure and at room temperature the density of the neutral atoms of Helium remaining in the plasma source chamber 28 is $1.76*10^{13}$ (atoms/cm$^3$). The mean free path of these neutral atoms is several meters, which is much greater than the plasma discharge chamber 28 diameter of about 10.0 cm.

Under the aforementioned parameter conditions, the ratio of the density of neutral atoms in the plasma discharge chamber 28 and the density of neutral atoms in the charge exchange chamber 36 is inversely proportional to the square root of the ratio of the temperatures. The wall temperature in the chamber 36 is maintained at about 4.2° K. However, due to possible parasitic heat penetration into the chamber 36, the temperature of the Helium gas could be higher, and 10° K. is a more realistic value. Therefore the density of cold Helium neutral atoms inside the chamber 36 is $n = 9.6*10^{13}$ atoms/cm$^3$. A gas temperature in the range of from 4.2 to 20° K. is suitable for the present invention.

In the energy range up to 20eV, the charge exchange cross section between warm Helium ions and cooled Helium atoms is $\sigma_{ce} = 2*10^{-15}$ cm$^2$. Therefore the charge exchange length in the cryogenic charge exchange chamber 36 is:

$$\lambda_{ce} = 1/ \text{i } n^* \sigma_{ce} = 5.2 cm$$

All the parasitic processes caused by electron-atom and ionatom collisions do not exceed the geometrical cross section of the atom of Helium which is $\sigma_g = 3.5 *10^{-16}$ cm$^2$. Thus, parasitic processes will only be significant if the length of the charge exchange chamber exceeds a characteristic length L, which is:

$$L = 1/n^* \sigma_g = 30 cm$$

A length must be chosen for the charge exchange chamber 36 so that charge exchange is obtained and the resulting ions do not become heated by parasitic processes. This means that the length required to obtain satisfactory charge exchange chamber 36 is greater than 5.2 cm and the length required to avoid undesired heating is less than 30 cm. A length of about 10 cm has been found to be suitable.

The ion density needed from the charge exchange chamber 36, to obtain a current density of $J = 1$ mA/cm$^2$, can be calculated in the following manner. The ambipolar diffusion velocity at 10 eV electron temperature is:

$$v = \sqrt{(2*k*T_e/M_i)} = 2.2*10^6 \text{ cm/s,}$$

where k is the Boltzman constant, and $M_1$ is the ion mass. The ion density necessary to obtain a current density of $J=1mA/cm^2$ with the previously calculated ambipolar diffusion velocity is:

$$n = J/e*v = 2.8*10^9 \ (ions/cm^3).$$

This ion density is easily obtained from 2.45 GHz microwave source ECR plasma discharges. Specifically, to obtain a Helium ion flow with this ion density and velocity and having a diameter of 2 cm, the microwave power needed is:

$$P_\mu = I*n*S*v = 7*10^{-2} \text{ watts}$$

where I is the ionization potential for atomic Helium, and S is the cross section of the plasma flow.

Due to losses for light emission, thermoconductivity, as well as other losses, the value of microwave power used is preferably raised to approximately 10 watts.

At $1mA/cm^2$ of ion current density, the 10 μA preferably supplied by the present invention can be provided with an extraction orifice radius of 0.56 mm (560 μm).

In accordance with the present invention, a 0.56 mm radius orifice, taken together with the other parameters discussed above, will provide a resolution of less than 0.2 μm, more preferably less than 0.1 μm. The virtual emitter radius, $R_{vs}$, which is 20.5 times the resolution value, can be solved from the following equation:

$$R_s = \sqrt{R_{vs}(R_{ret}/D_{rs})(e*V/k*T_i)}$$

where $R_s$ is the orifice radius, $R_{ret}/D_{rs}$ is the geometrical parameter which is $<<1$, e is the ion charge, V is the extracting potential, k is the Boltzman constant, and $T_1$ is the ion temperature. See Miller, J., *Vac. Sci. Tech.* B7 (5) pp. 1053–1063 (Sept./Oct. 1989). Selecting $R_s=0.56$ mm, $V=50$ kV, $T_1=10°$ K. and $R_{ret}/D_{rs}=0.1$, we obtain $R_{vs}=0.73$ μm. Dividing this number by a factor of 20.5 yields a resolution of 0.036 μm.

The ion-atom charge exchange cell 18 is used to convert a converging ion beam into a converging atom beam. This is done to minimize electrostatic distortion of the encoded information in an ion beam. The information, which is the image or pattern to be etched, is coded in the momentum and position of each ion in a cross section of the converging ion beam. The coding preferably occurs by passing the beam through a mask 19 (or like object) containing an image or pattern. The mask may be positioned in the beam path by a suitable structure that holds the mask in the correct orientation and does not interfere with the beam.

To minimize the distortion of the encoded information, the charge exchange that occurs between ions and neutral atoms during ion-atom collisions in the cell 18, should occur in such a way that minimizes energy and momentum exchange. Energy exchange may be minimized by an appropriate choice of the target neutral gas that is penetrated by the ion beam. Momentum exchange may be minimized by an appropriate choice of the target gas density and the length (depth) of the gas target in the cell 18.

At least two mechanisms affect the energy and momentum exchange between a projectile ion and a neutral target atom. The first is the internal (potential) energy exchange which might be partially converted into kinetic energy. The second is the kinetic energy exchange that occurs as a result of the collision between the projectile and target. The kinetic energy exchange is connected with the momentum exchange, which causes scattering.

An internal (potential) energy transfer takes place between a projectile ion and a target atom when the bound energy or ionization potential of the transferred electron is different in the projectile and the target particles. The charge exchange process can be expressed by the following equation:

$$X(+) + Y \rightarrow X + Y(+) + E$$

where $X(+)$ is the projectile ion, Y is the target atom and E is the bound energy (ionization potentials) difference before and after the electron charge exchange. Potentially, E can be converted entirely or partially into the kinetic energy.

Optimally, to eliminate the energy difference E, the nature of the projectile gas particle must be the same as the nature of the target gas particle so that $X=Y$. This is known as a symmetric resonant charge exchange process. Further, for the symmetric resonant charge exchange, the cross-section for the $He+\rightarrow He$ at an energy of collision of 50 keV (a value of interest for the converging atomic beam lithography of the present invention) corresponds to $$\sigma_{ce} = 1.2*10^{-15} \ cm^2.$$

This value is much larger than the corresponding elastic scattering cross-section which for light elements such as Helium, and at the energy of collision of 50 keV is $$\sigma_2 = 4\pi a_0^2 (I/I_h)^{-1} = 2*10^{-16} \ cm^2$$

where $a_0$ is the Bohr radius, I is the ionization potential of the given element (helium), and $I_h$ is the ionization potential of hydrogen, 13.6 eV. Thus, the free path for scattering is about six times longer than the free path for charge exchange. This provides for selecting the dimensions of the charge exchange cell 18 to provide for effective charge exchange without any significant exchange of energy and momentum.

Accordingly, the physical structure of the charge exchange cell 18 can be designed in various ways in accordance with the present invention. However, the depth of the target gas as delimited by the physical structure of cell 18, should be smaller than the free path for scattering but larger than the free path for charge exchange. This relation allows charge exchange to occur without significant momentum and energy exchange or scattering which would cause loss of information during the ion-atom beam transformation.

The charge exchange cell 18 could be a supersonic flow of target gas jet which is injected transverse to the flow of the converging ion beam. Such a flow is conventionally obtained by accelerating an ultrasonic gas flow using a conventional laval nozzle (not shown). Alternatively, the target gas could be placed in a separate chamber which has an orifice to allow the ion beam to enter the chamber.

In one embodiment of the present invention the target gas density and depth or the physical structure which delimits the depth of the target gas are chosen as follows. The mean free path λ for an ion-atom or an atom-atom collision is:

$$\lambda = (n\sigma)^{-1}$$

where n is the target gas density, and $\sigma$ is the cross section for a collision process. As stated previously, the present invention is designed to allow charge exchange without (or with minimal) energy and momentum exchange. Accordingly, the depth of the target, L, should be larger than the mean free path for charge exchange and smaller than the mean free path for scattering. Accordingly, the following restrictive conditions must be satisfied:

$$\sigma^{-1}_{ce} < nL < \sigma_s^{-1}$$

This means than the gas target density n times the depth of the target L must be greater than the inverse of the charge exchange cross section and less than the inverse of the scattering cross section.

For instance, in the case of a helium ion beam with an energy of 10 keV, the gas target should have the following parameters:

$$0.83 * 10^{15} \, cm^{-2} < nL < 5 * 10^{15} \, cm^{-2}$$

In this case, if the depth of the target helium gas is 10 cm, then the Helium target gas should have a density of $2*10^{14}$ atoms/cm$^3$ which is well within the limits specified by the above equation. A Helium density of $2*10^{14}$ cm$^3$ corresponds to a pressure of $8*10^{-3}$ Torr. This pressure and density can be realistically reached by providing differential pumping in a conventional manner.

Another aspect of the present invention concerns producing masks and other devices useful for ultra fine etching using a converging ion beam. In this embodiment, low energy ions should be used for etching desired patterns of lines and/or holes in the mask.

The present invention can be used with conventional fine pattern processing which involves the use of resist which may be exposed and developed to produce a mask for semiconductor doping and removed following the doping. The present invention also can be advantageously used to etch a pattern without the use of pattern transfer media such as photoresist. For example, direct focussed low energy atomic beam milling as a selective ultrafine etching of a metal film, which has been deposited on the substrate for subsequent diffusion, could substantially minimize the number of processing steps for fabricating an integrated circuit. Thus the present invention is also a novel approach to high throughput submicron integrated circuit fabrication.

One skilled in the art will appreciate that the present invention can be practiced by other than the described embodiments which are presented for purposes of illustration and not of limitation.

We claim:

1. Apparatus for producing a converging particle beam for lithographic processing of a target comprising:
    a first chamber for receiving a first gas and igniting the first gas to form a plasma including ions;
    a second chamber having a supply of a neutral second gas including atomic particles, an output aperture and an input aperture, the second gas having a temperature selected in the range of from 4.2 to 20 degrees Kelvin, the input aperture receiving plasma ions from the first chamber so that the plasma ions transfer their charge to the cool second gas to form cool second gas ions and neutral particles, whereby the cool second gas ions form a cryogenic ion beam at the output aperture and
    a beam system for forming the cryogenic ion beam into a converging cryogenic ion beam for irradiating the target.

2. The apparatus of claim 1 further comprising an ion energy monochromator for receiving the ion beam from the output aperture and selectively passing ions having a selected thermal energy range.

3. The apparatus of claim 2 wherein the selected energy level range is between 1.0 and 100 KeV.

4. The apparatus of claim 3 wherein the beam system further comprises one of an electrostatic and a magnetic structure to transform the ion beam into a converging ion beam.

5. The apparatus of claim 1 further comprising:
    a magnetic system for producing a magnetic field profile along the first and second chambers to that the charged plasma particles diffuse along the magnetic field from the first chamber to the second chamber; and
    a pump for extracting neutral particles from the plasma flowing between the first and second chambers.

6. The apparatus of claim 5 wherein the first chamber and the magnetic field system further comprises an ECR plasma source.

7. The apparatus of claim 5 wherein the first chamber further comprises a dielectric tube having an open end facing the second chamber, the tube receiving the first gas and igniting the first gas to form the plasma inside the tube.

8. The apparatus of claim 5 wherein the magnetic field system further comprises a plurality of axisymmetric magnetic devices selected from among the group consisting of electromagnets, permanent magnets, and solenoids.

9. The apparatus of claim 5 wherein charge exchange cell further comprises an aperture for receiving a neutral third gas so that the third gas is penetrated by the ion beam, the cell having a length in the direction of travel of the beam that is less that the mean free path of ions for charge exchange and greater than the mean free path of ions for scattering.

10. The apparatus of claim 9 wherein the aperture further comprises a jet for injecting the third gas into the cell at supersonic speed.

11. The apparatus of claim 9 wherein the density of the third gas times the length of the cell is greater than the inverse of the charge exchange cross section and less than the inverse of the scattering cross section.

12. The apparatus of claim 9 wherein the third gas is the same as the second gas and the pressure of the cell is in the range selected from between $10^{-1}$ and $10^{-4}$ Torr.

13. The apparatus of claim 12 wherein the third gas is helium, the density of helium in the cell is on the order of $10^{14}$ atoms/cm$^2$, and the pressure in the cell in on the order of $10^{-3}$ Torr.

14. The apparatus of claim 1 further comprising:
    a housing for containing a cooling medium exterior to and in contract with the second chamber, the cooling medium being maintained at or below the said temperature; and
    an inlet for passing the second gas through the cooling medium and into the second chamber so that the second gas is cooled to said temperature.

15. The apparatus of claim 14 wherein the first and second gases are the same, the first chamber and the magnetic field system further comprise an ECR plasma source, the dimension of the output aperture is at least an order of magnitude smaller than the dimension of the plasma produced by the first chamber, and the second chamber has a length, in the direction of the plasma flow, that is greater than the charge exchange length and less than the characteristic length for the first gas.

16. The apparatus of claim 15 wherein the first and second gas is helium, the length of the second chamber is selected from between 5.2 and 30 cm, and the output aperture diameter is selected from between 0.1 and 1.0 cm.

17. The apparatus of claim 15 wherein the first and second gas is hydrogen, the length of the second chamber is selected from between 3 and 30 cm, and the output aperture diameter is selected from between 0.1 and 1.0 mm.

18. The apparatus of claim 15 further comprising a pump for maintaining the first and second chambers at a pressure on the order of from $10^{-3}$ to $10^{-6}$ Torr.

19. The apparatus of claim 1 wherein the dimension of the output aperture is at least an order of magnitude smaller than the dimension of the ignited plasma.

20. Apparatus for use in lithography comprising a heavy particle beam generator having a beam output including charged particles a cooling chamber containing a neutral target gas at a cryogenic temperature and having an input for receiving said beam output so that said beam interacts with said neutral target gas to transfer charge from said beam to said target gas, thereby producing a cryogenic heavy particle beam.

21. The apparatus of claim 20 wherein the temperature of the cryogenic beam is selected from between 4.2 and 20° K.

22. Apparatus for producing a cooled ion beam comprising:
   a plasma source for producing a plasma having neutral and charged particles including ions;
   a chamber having a first input for receiving the charged plasma particles, a second input for receiving a neutral target gas at a cool temperature, the first and second inputs being positioned so that a charge exchange occurs between the plasma ions and the target gas, thereby providing cool ions; and
   an extraction orifice associated with the chamber output for extracting a cool ion beam from the chamber.

23. The apparatus of claim 22 and wherein the plasma source generates a plasma by igniting a support gas under ECR conditions.

24. The apparatus of claim 22 wherein the chamber is cooled to a temperature in the range of from 4.2° to 20° K.

25. The apparatus of claim 24 and wherein the neutral cool target gas further comprises a supply of one of liquid helium and liquid hydrogen.

26. The apparatus of claim 22 wherein the chamber further comprises a cooling medium and the second input passes through the cooling medium so that the neutral target gas is cooled and the charge exchange occurs between the plasma ions and the cooled neutral gas inside the chamber.

27. The apparatus of claim 26 and wherein the plasma source is an ECR plasma source.

28. The apparatus of claim 26 and wherein the cooling medium is one of liquid helium and liquid hydrogen.

29. The apparatus of claim 26 wherein the charge exchange between the plasma ions and the neutral gas atoms in the chamber has a corresponding energy exchange that is below $10^{-3}$ eV.

30. The apparatus of claim 26 wherein the extraction orifice has a selected extraction potential and further comprising an ion energy monochromator for receiving the cool ion beam from the extraction orifice and selectively passing cool ions having a kinetic energy corresponding to the extraction potential.

31. The apparatus of claim 22 further comprising a pump interposed between the plasma source and the chamber for extracting neutral particles out of the plasma.

32. A method for producing a particle beam for use in lithographic processing of a target comprising the steps of generating a cryogenic ion beam, removing from the cryogenic ion beam ions having a thermal energy above a selected thermal energy level, and causing the cryogenic ion beam to converge.

33. The method of claim 32 wherein the selected thermal energy level is in the range of from 1.0 to 100 KeV.

34. A method for producing a particle beam for use in lithographic processing of a target comprising the steps of:
   generating a warm plasma from a first gas;
   causing the charged plasma particles to diffuse along a magnetic field;
   processing the charged plasma particles to produce cool ions;
   extracting cool ions to form a cryogenic ion beam; and
   causing the cryogenic ion beam to converge.

35. The method of claim 34 wherein generating the plasma further comprises igniting the first gas under ECR conditions.

36. The method of claim 34 further comprising removing neutral particles from the diffusing plasma before processing the plasma.

37. The method of claim 34 wherein processing the plasma further comprises:
   cooling a second gas including atomic particles to a temperature selected from between 4.2° and 20° K.;
   placing the cooled gas in a chamber; and
   penetrating the cooled second gas with the charged plasma so that the plasma ions transfer their charge to the cooled second gas to produce cooled second gas ions and neutral plasma atoms.

38. The method of claim 37 wherein extracting cooled ions further comprises providing the chamber with an output aperture having a diameter that is smaller than the diameter of the generated diffusing plasma and a length, in the direction of the plasma flow, that is greater than the charge exchange length and less than the characteristic length for the first gas.

39. The method of claim 38 wherein the first and second gases are the same.

40. The method of claim 38 wherein further comprising removing from the cryogenic ion beam ions having a thermal energy above a thermal energy level of $10^{-3}$ eV.

41. The method of claim 38 further comprising the step of converting the converging ion beam to a converging atom beam.

42. The method of claim 41 further comprising the step of removing charged particles from the converted converging atom beam.

43. A method of generating a cyrogenic particle beam, comprising the steps of:
   providing a source of ions;
   providing a cooled neutral target gas;
   supplying the ions and the neutral cooled target gas to a first chamber and causing a charge exchange between the ions and the cooled neutral target gas, thereby to form cool target gas ions and neutral particles in the first chamber; and
   extracting a cool ion beam through an extraction orifice in the first chamber.

44. The method of claim 43 wherein the step of providing a source of ions further comprises generating a plasma in a second chamber.

45. The method of claim 44 wherein the second chamber further comprises a dielectric tube containing a flow of plasma support gas.

46. The method of claim 44 wherein supplying the plasma ions to the first chamber further comprises passing the plasma particles from the second to the first chamber and removing neutral particles from the plasma before the plasma reaches the first chamber.

47. The method of claim 44 further comprising generating the plasma under ECR conditions.

48. The method of claim 43 wherein providing a cooled neutral target gas further comprises passing the neutral gas through a cooling medium before supplying the chamber with the cooled neutral target gas.

49. The method of claim 43 wherein causing a charge exchange further comprises minimizing the energy exchange which occurs between the ions and the neutral target gas in the first chamber to below ion beam temperature.

50. The method of claim 43 wherein supplying the cooled target gas further comprises controlling the target gas pressure in the first chamber so that the charge exchange occurs with minimal energy exchange.

51. The method of claim 43 further comprising the step of converting the cryogenic ion beam to a cryogenic atom beam.

52. The method of claim 43 further comprising passing the cryogenic ion beam through an energy monochromator to obtain a cryogenic ion beam of a small energy spread.

* * * * *

UNITED STATES PATENT AND TRADEMARK OFFICE
CERTIFICATE OF CORRECTION

PATENT NO. : 5,352,899

DATED : October 4, 1994

INVENTOR(S) : METHOD AND APPARATUS FOR FABRICATING A DEVICE/CIRCUIT PATTERN BY A CONVERGING ATOMIC BEAM

It is certified that error appears in the above-indentified patent and that said Letters Patent is hereby corrected as shown below:

Col. 1, line 68, "$T_1$" should be -- $T_i$ --.

Col. 2, line 1, "$T_1$" should be -- $T_i$ --.

Col. 6, line 11, "$T_1$" should be -- $T_i$ --.

Col. 6, line 12, "$T_1$" should be -- $T_i$ --.

Col. 6, line 41, "$\lambda_{ce}=1/i\ n*\sigma_{ce}=5.2 cm$" should be -- $\lambda_{ce}=1/n*\sigma_{ce}=5.2 cm$ --.

Col. 6, line 46, "$cm\ ^2$" should be -- $cm^2$ --.

Col. 7, line 1, "$M_1$" should be -- $M_i$ --.

Col. 7, line 36, "$T_1$" should be -- $T_i$ --.

Col. 7, line 38, "$T_1$" should be -- $T_i$ --.

Col. 8, line 38, "$I_h$" should be -- $I_B$ --.

Col. 9, line 16, "than" should be -- that --.

Col. 9, line 29, "$cm^3$" should be -- $cm^{-3}$ --.

UNITED STATES PATENT AND TRADEMARK OFFICE
CERTIFICATE OF CORRECTION

PATENT NO. : 5,352,899
DATED : October 4, 1994
INVENTOR(S) : METHOD AND APPARATUS FOR FABRICATING A DEVICE/CIRCUIT PATTERN BY A CONVERGING ATOMIC BEAM It is certified that error appears in the above-indentified patent and that said Letters Patent is hereby corrected as shown below:

Col. 10, line 42, "is less that" should be -- is less than --.

Col. 12, line 59, delete "wherein".

Signed and Sealed this

Fifteenth Day of August, 1995

Attest:

BRUCE LEHMAN

Attesting Officer          Commissioner of Patents and Trademarks